US011950404B2

(12) United States Patent
Kim

(10) Patent No.: US 11,950,404 B2
(45) Date of Patent: Apr. 2, 2024

(54) MEMORY DEVICE

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 170 days.

(21) Appl. No.: 17/212,633

(22) Filed: Mar. 25, 2021

(65) Prior Publication Data

US 2022/0122976 A1 Apr. 21, 2022

(30) Foreign Application Priority Data

Oct. 16, 2020 (KR) .......................... 10-2020-0134458

(51) Int. Cl.
*H10B 12/00* (2023.01)
*G11C 8/14* (2006.01)
*G11C 11/4097* (2006.01)
*H01L 23/528* (2006.01)

(52) U.S. Cl.
CPC ............... *H10B 12/30* (2023.02); *G11C 8/14* (2013.01); *G11C 11/4097* (2013.01); *H01L 23/5283* (2013.01)

(58) Field of Classification Search
None
See application file for complete search history.

(56) References Cited

U.S. PATENT DOCUMENTS

| 9,484,314 | B2 | 11/2016 | Shimoda et al. | |
|---|---|---|---|---|
| 9,893,074 | B2 | 2/2018 | Lee et al. | |
| 10,256,252 | B1* | 4/2019 | Kanazawa | H01L 29/40117 |
| 2011/0201167 | A1* | 8/2011 | Satonaka | H01L 27/11575 257/E21.423 |
| 2016/0307761 | A1* | 10/2016 | Fang | H01L 21/2885 |
| 2019/0074277 | A1* | 3/2019 | Ramaswamy | H01L 27/0688 |

* cited by examiner

*Primary Examiner* — Mohammad M Hoque
*Assistant Examiner* — Kevin Quinto
(74) *Attorney, Agent, or Firm* — IP & T GROUP LLP

(57) ABSTRACT

A memory device includes: a word line stack including word lines that are alternately stacked vertically over a substrate, and having an edge portion; at least one supporter extending vertically in a direction that the word lines are stacked and supporting the edge portion of the word line stack; contact plugs that are electrically connected to the word lines at the edge portion of the word line stack; and active layers positioned between the word lines, and horizontally oriented in a direction intersecting with the word lines.

26 Claims, 16 Drawing Sheets

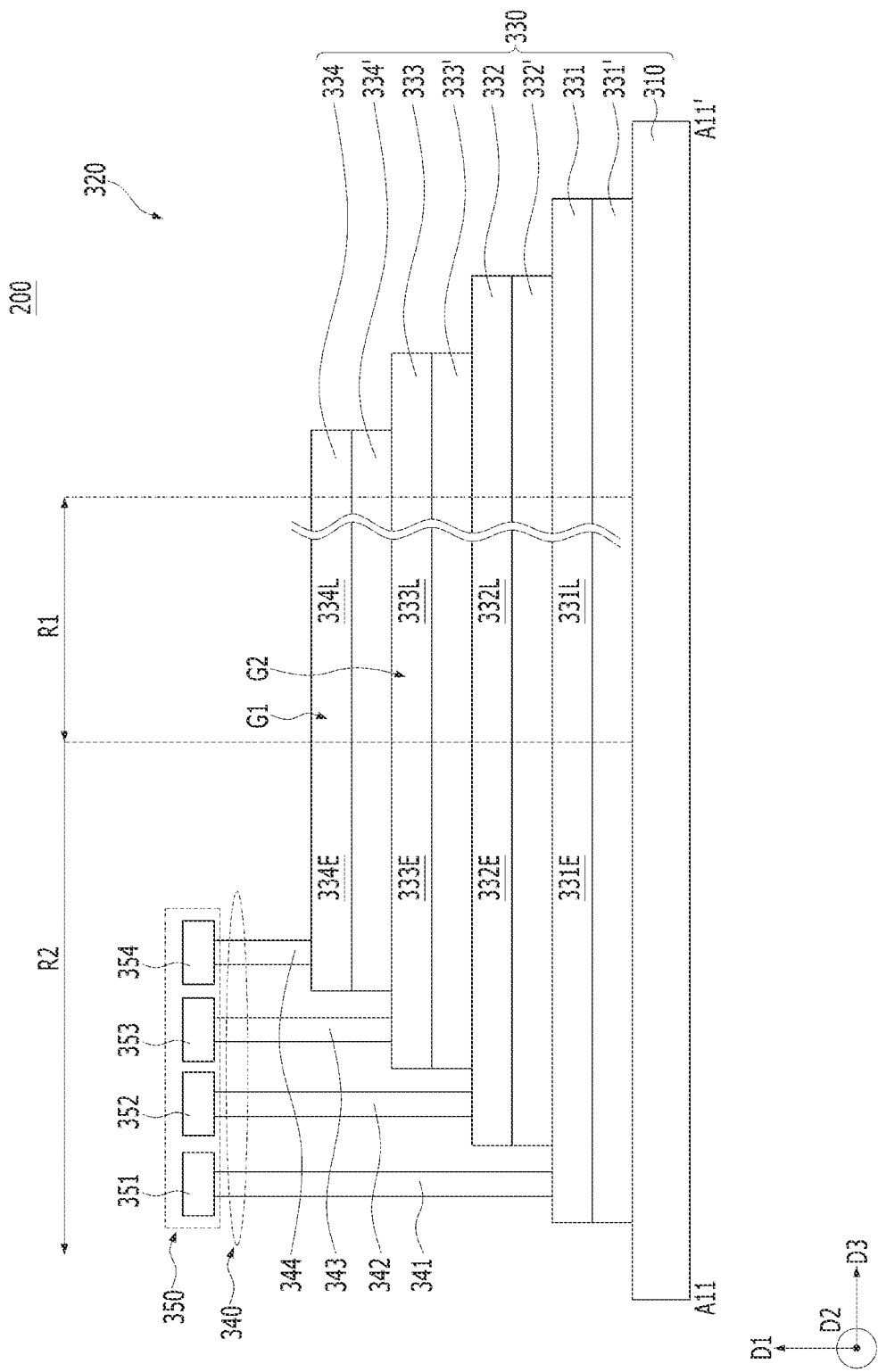

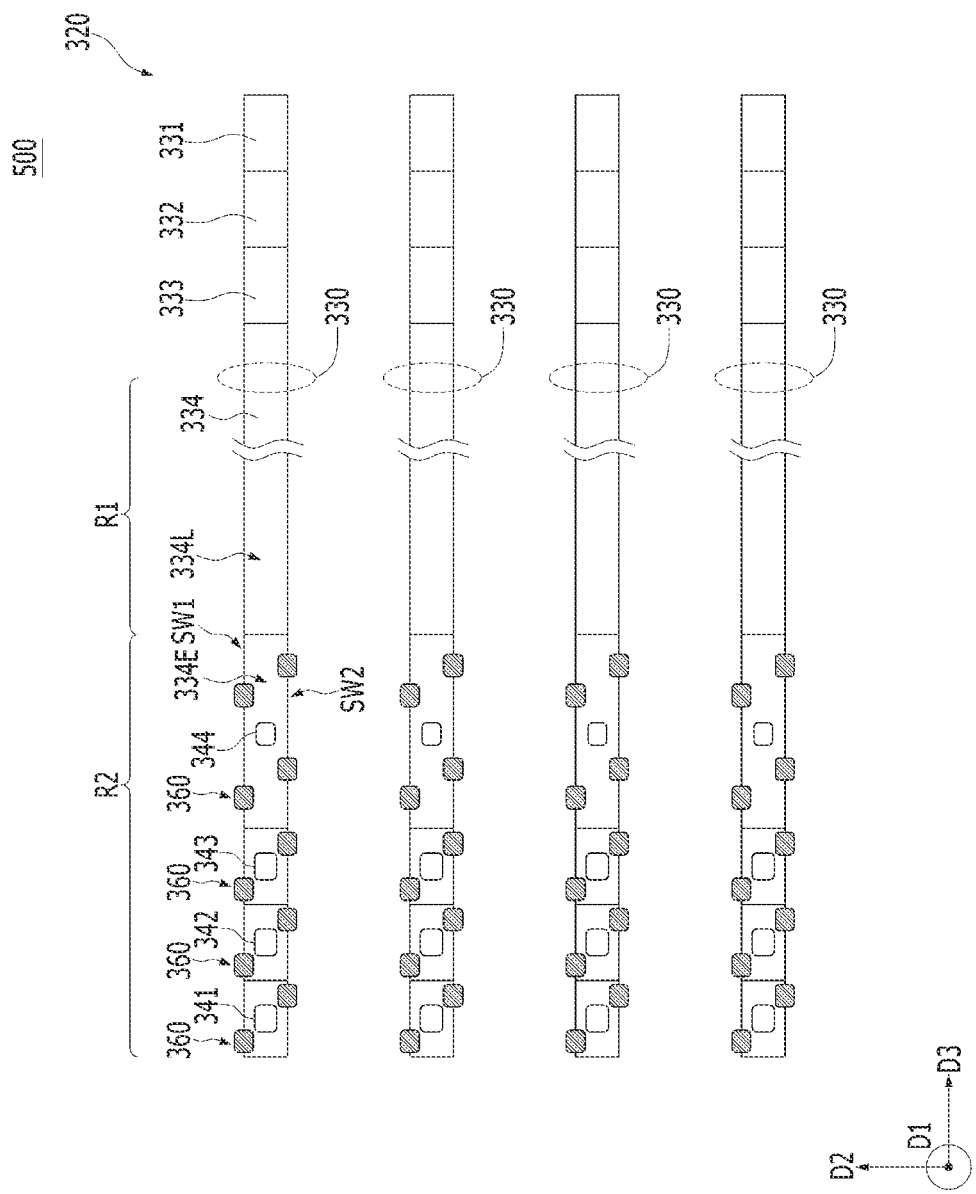

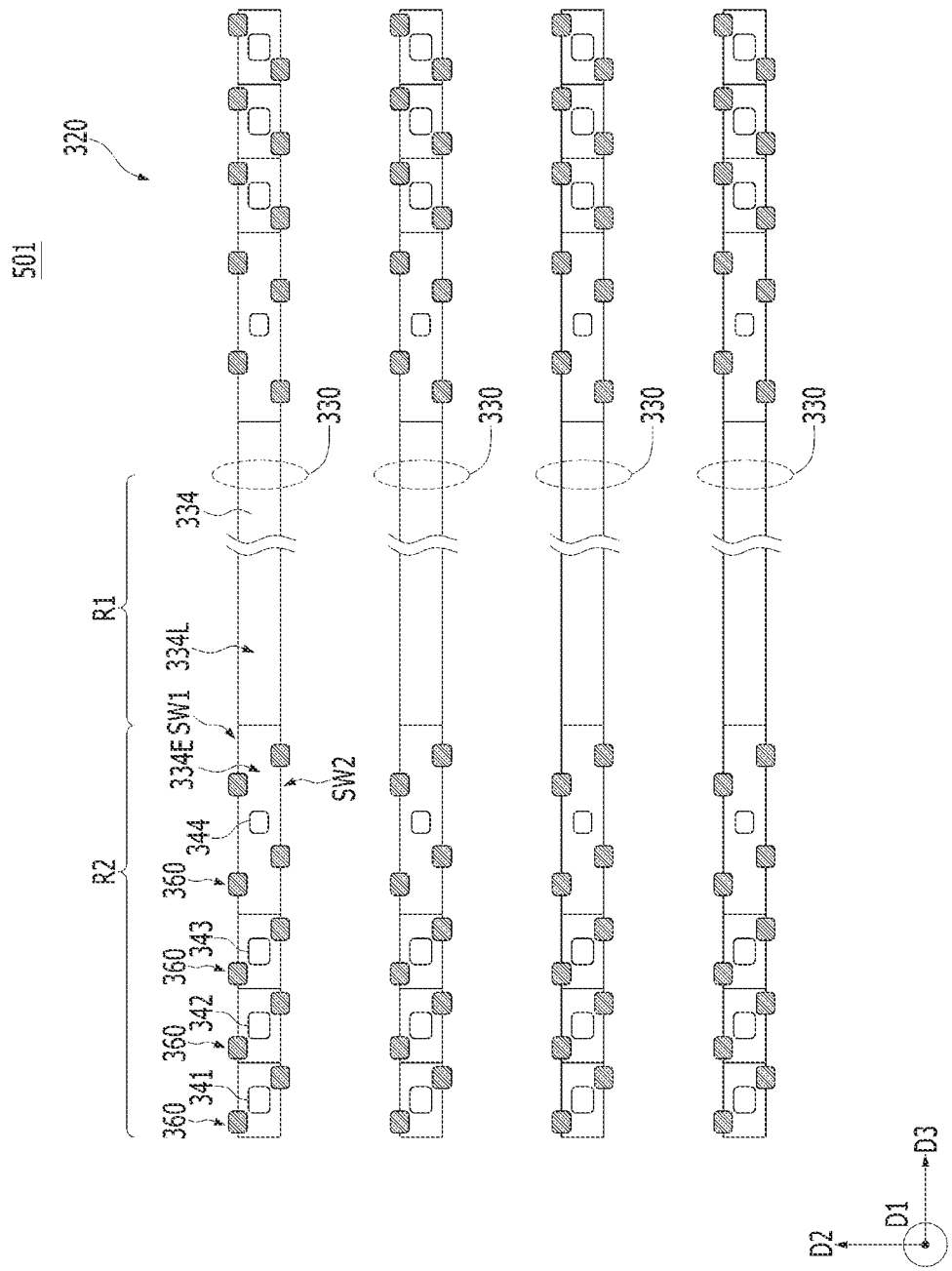

MEMORY DEVICE

CROSS-REFERENCE TO RELATED APPLICATIONS

The present application claims priority to Korean Patent Application No. 10-2020-0134458, filed on Oct. 16, 2020, which is incorporated herein by reference in its entirety.

BACKGROUND

1. Field

Various embodiments of the present invention relate to a semiconductor memory device and, more particularly, to a memory device.

2. Description of the Related Art

Recently, the size of memory cells has been continuously reduced in order to increase the net die of a memory device.

As the size of memory cells becomes smaller, parasitic capacitance (Cb) should be reduced and the capacitance should be increased. However, it is difficult to increase the net die due to structural limitations of the memory cells.

SUMMARY

Embodiments of the present invention are directed to a highly integrated memory device.

In accordance with an embodiment of the present invention, a memory device includes: a word line stack including word lines that are alternately stacked vertically over a substrate, and having an edge portion; at least one supporter extending vertically in a direction that the word lines are stacked and supporting the edge portion of the word line stack; contact plugs that are electrically connected to the word lines at the edge portion of the word line stack; and active layers positioned between the word lines, and horizontally oriented in a direction intersecting with the word lines.

In accordance with another embodiment of the present invention, a memory device includes: a word line stack including word lines that are alternately stacked perpendicular to a substrate, and including an edge portion and an additional edge portion which is parallel to the edge portion; at least one small supporter extending vertically in a direction that the word lines are stacked and supporting the edge portion and the additional edge portion, respectively; at least one large supporter extending vertically in the direction that the word lines are stacked and supporting the edge portion and the additional edge portion in common; contact plugs respectively electrically connected to the word lines in the edge portion; additional contact plugs electrically connected to the word lines respectively in the additional edge portion; and active layers positioned between the word lines, and horizontally oriented in a direction intersecting with the word lines.

In accordance with yet another embodiment of the present invention, a memory device includes: a plurality of memory cells vertically stacked over a substrate; and at least one supporter extending vertically in a direction that the memory cells are stacked, wherein each of the memory cells includes: a bit line oriented perpendicular to the substrate; a capacitor horizontally spaced apart from the bit line; an active layer horizontally oriented between the bit line and the capacitor; and a word line positioned over at least one surface among an upper surface and a lower surface of the active layer and extending horizontally in a direction intersecting with the active layer, wherein edge portions of the word lines of the memory cells supported by the supporter.

These and other features and advantages of the present invention may become better understood by the person having ordinary skill in the art to which the invention pertains.

BRIEF DESCRIPTION OF THE DRAWINGS

FIGS. 4A and 4B illustrate a memory device in accordance with an embodiment of the present invention.

FIGS. 8A to 9B are diagrams illustrating memory devices in accordance with other embodiments of the present invention.

DETAILED DESCRIPTION

Figure 1:
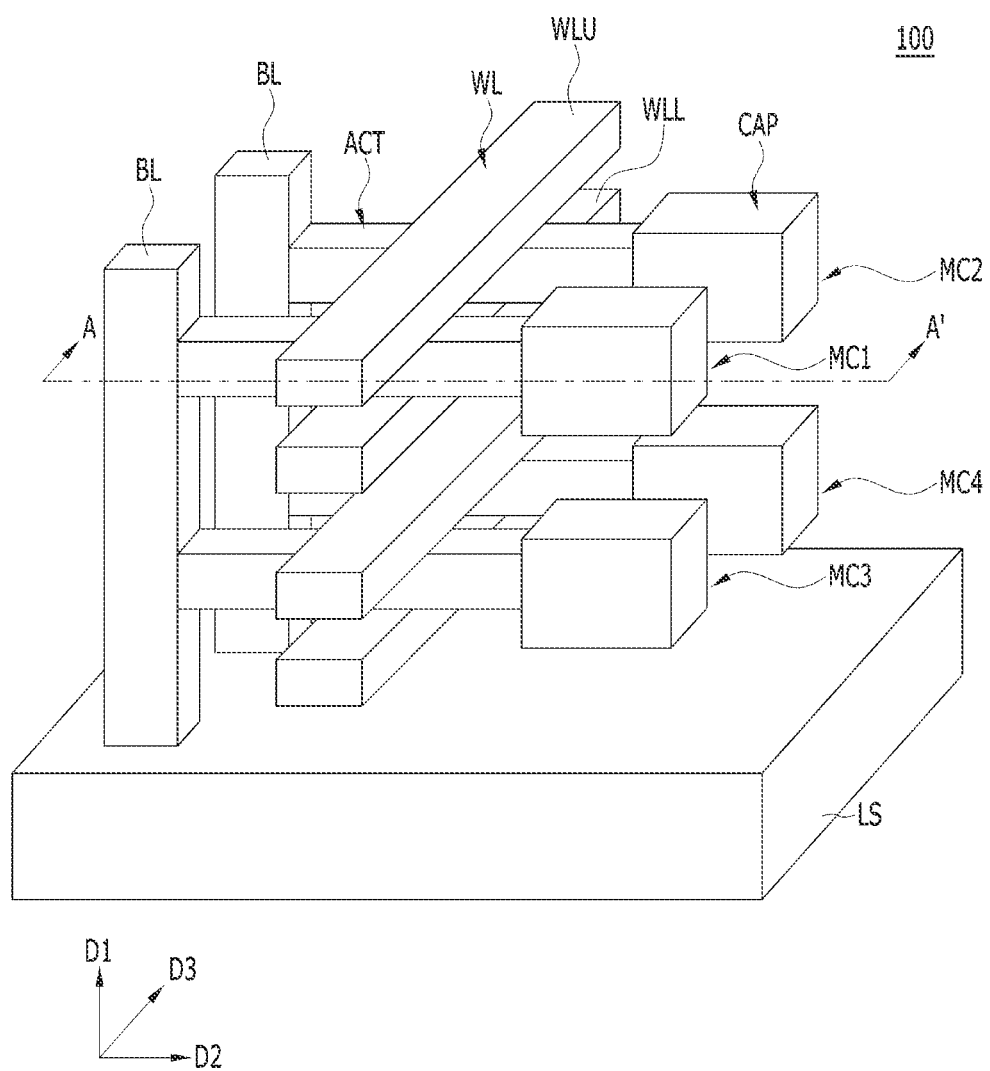
FIG. 1 is a schematic perspective view illustrating a semiconductor device in accordance with an embodiment of the present invention.

Various embodiments of the present invention may be described below in more detail with reference to the accompanying drawings. The present invention may, however, be embodied in different forms and should not be construed as limited to the embodiments set forth herein. Rather, these embodiments are provided so that this disclosure may be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In the following embodiments of the present invention, memory cell density may be increased while reducing parasitic capacitance by vertically stacking memory cells.

Figure 2:
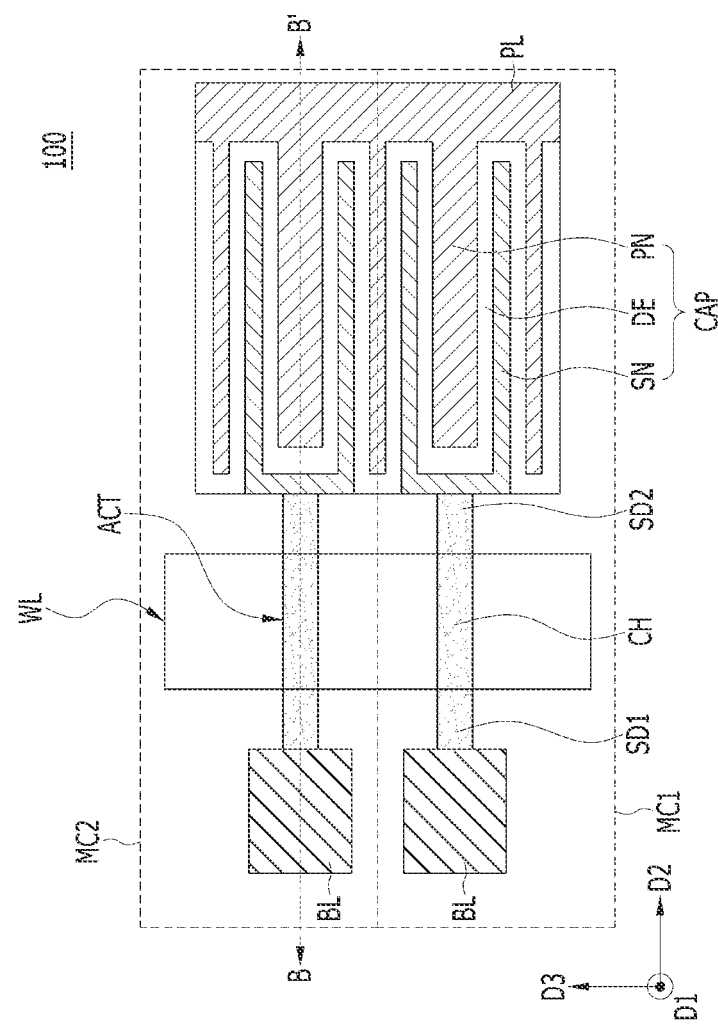
FIG. 2 is a layout taken along a line A-A' shown in FIG. 1.
Figure 3:
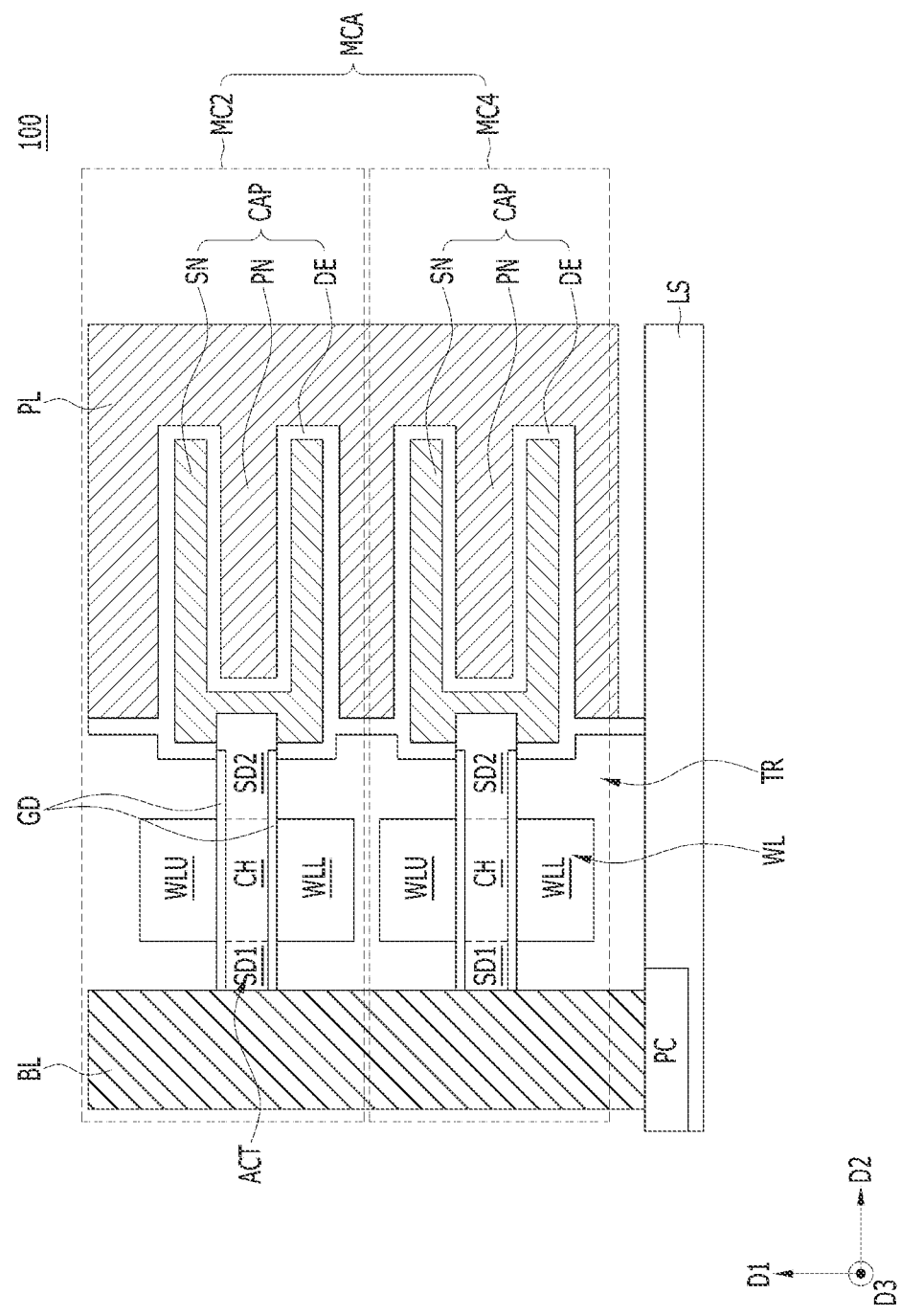
FIG. 3 is a cross-sectional view taken along a line B-B' shown in FIG. 2.

FIG. 1 is a schematic perspective view illustrating a semiconductor device in accordance with an embodiment of the present invention. FIG. 2 is a layout taken along a line A-A' shown in FIG. 1. FIG. 3 is a cross-sectional view taken along a line B-B' shown in FIG. 2.

Referring to FIGS. 1 to 3, the semiconductor device 100 may include a substrate LS, and a memory cell array MCA formed over the substrate LS. The memory cell array MCA may be oriented perpendicular to the substrate LS in a first direction D1. The substrate LS may include a plane defined by a second and third direction D2 and D3. The memory cell array MCA may be oriented perpendicular to the plane of the substrate LS. The memory cell array MCA may be vertically oriented upwardly from the substrate LS in a first direction D1. The memory cell array MCA may include a three-dimensional array of memory cells MC. The memory cell array MCA may include a plurality of memory cells MC1, MC2, MC3, and MC4, as shown in FIG. 1, however, this is only an example.

For example, the memory cell array MCA may include a first memory cell MC1, a second memory cell MC2, a third memory cell MC3, and a fourth memory cell MC4. The first and third memory cells MC1 and MC3 may be vertically oriented in the first direction D1 to form a first vertical column. The second and fourth memory cells MC2 and MC4 may be vertically oriented in the first direction D1 to form a second vertical column. The third and fourth memory cells MC3 and MC4 may be horizontally oriented in the third direction D3 to form a first horizontal row. The first and second memory cells MC1 and MC2 may be horizontally oriented in a third direction D3 to form a second horizontal row. It is noted that more than two memory cells may be arranged in each column and row. Moreover, more than two rows and/or more than two rows and columns of memory cells may be employed without departing from the scope of the claimed invention. Each of the memory cells MC1, MC2, MC3, and MC4 of the memory cell array MCA may include a bit line BL, a transistor TR, a capacitor CAP, and a plate line PL. The transistor TR and the capacitor CAP may be horizontally oriented in the second direction D2. Each of the memory cells MC1, MC2, MC3, and MC4 may further include a word line WL extending in the third direction D3. In each of the memory cells MC1, MC2, MC3 and MC4, the bit line BL, the transistor TR, the capacitor CAP, and the plate line PL may be positioned in a horizontal arrangement along the second direction D2. The memory cell array MCA may include a Dynamic, Random-Access Memory (DRAM) memory cell array, however, the invention may not be limited in this way. For example, in variations of the illustrated embodiment and in other embodiments, the memory cell array MCA may include a Phase-Change, Random-Access Memory (PCRAM), a Resistive, Random-Access Memory (RERAM), a Magnetic, Random-Access Memory (MRAM), and the like. Also, in variations of the illustrated embodiment and in other embodiments, the capacitor CAP may be replaced by another memory element.

The substrate LS may be formed of one or more materials suitable for semiconductor processing. For example, suitable materials for the substrate LS may include at least one among a conductive material, a dielectric material, and a semiconductor material. Diverse materials may be formed over the substrate LS. The substrate LS may include a semiconductor substrate. The substrate LS may be formed of a silicon-containing material. The substrate LS may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate LS may also include other semiconductor materials, such as germanium. The substrate LS may include a III/V-group semiconductor substrate, for example, a compound semiconductor substrate, such as GaAs. The substrate LS may include a Silicon-On-Insulator (SOI) substrate.

According to another embodiment of the present invention, the substrate LS may include a peripheral circuit portion PC (not shown). The peripheral circuit portion PC may include a plurality of control circuits for controlling a memory cell array MCA. At least one control circuit of the peripheral circuit portion PC may include an N-channel transistor, a P-channel transistor, a CMOS circuit, or a combination thereof. At least one control circuit of the peripheral circuit portion PC may include an address decoder circuit, a read circuit, and a write circuit. At least one control circuit of the peripheral circuit portion PC may include a planar channel transistor, a recess channel transistor, a buried gate transistor, and a fin channel transistor (FinFET), etc.

For example, at least one control circuit of the peripheral circuit portion PC may be electrically connected to the bit line BL. The peripheral circuit portion PC may include a sense amplifier SA, and the sense amplifier SA may be electrically connected to the bit line BL. Although not illustrated, a multi-level metal line MLM may be positioned between the memory cell array MCA and the substrate LS, and the peripheral circuit portion PC and the bit line BL may be coupled to each other through the multi-level metal line MLM.

The memory cell array MCA may include a stack of at least two or more memory cells MC. The at least two or more memory cells MC may be vertically stacked over the substrate LS in the first direction D1.

The bit line BL may extend in the first direction D1 from the substrate LS. A plane of the substrate LS may extend in the second direction D2, and the first direction D1 may be perpendicular to the second direction D2. The bit line BL may be vertically oriented from the substrate LS. The bottom portion of the bit line BL may be coupled to the substrate LS. The bottom of the bit line BL may be coupled to the peripheral circuit portion PC of the substrate LS. The bit line BL may have a pillar shape. The bit line BL may be referred to as a vertically oriented bit line or a pillar-type bit line. The bit line BL may include a conductive material. The bit line BL may include a silicon-based material, a metal-based material, or a combination thereof. The bit line BL may include polysilicon, a metal, a metal nitride, a metal silicide, or a combination thereof. The vertically stacked memory cells MC may share one bit line BL. The bit line BL may include polysilicon, titanium nitride, tungsten, or a combination thereof. For example, the bit line BL may include polysilicon or titanium nitride (TiN) which is doped with an N-type impurity. The bit line BL may include a stack of titanium nitride and tungsten (TiN/W). The bit line BL may further include an ohmic contact layer, such as a metal silicide.

The transistor TR may be disposed in a horizontal arrangement along the second direction D2 which is parallel to the surface of the substrate LS. That is, the transistor TR may be horizontally positioned between the bit line BL and the capacitor CAP. The transistor TR may be positioned at a higher level than the substrate LS, and the transistor TR and the substrate LS may be spaced apart from each other.

The transistor TR may include an active layer ACT, a gate dielectric layer GD, and a word line WL. The word line WL may extend in the third direction D3, and the active layer ACT may extend in the second direction D2. The third direction D3 may be a direction which is perpendicular to the first direction D1. The active layer ACT may be horizontally arranged and may extend from the bit line BL in the second direction D2. The active layer ACT may be oriented parallel to the plane of the substrate LS.

The word line WL may have a double word line structure with the active layer ACT interposed therebetween. A gate dielectric layer GD may be formed on the upper and lower surfaces of the active layer ACT. The word line WL may include an upper word line WLU and a lower word line WLL. The upper word line WLU may be disposed on the upper surface of the active layer ACT, and the lower word line WLL may be disposed under the lower surface of the active layer ACT. The gate dielectric layer GD may be formed between the upper word line WLU and the upper surface of the active layer ACT. The gate dielectric layer GD may also be formed between the lower word line WLL and the lower surface of the active layer ACT. The upper and lower word lines WLU and WLL may be spaced apart from the active layer ACT by the gate dielectric layer GD.

The gate dielectric layer GD may include, for example, silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSIO, HfSiON, and the like.

The word line WL may include a metal, a metal mixture, a metal alloy, or a semiconductor material. The word line WL may include titanium nitride, tungsten, polysilicon, or a combination thereof. For example, the word line WL may include a TiN/W stack in which titanium nitride and tungsten are sequentially stacked. The word line WL may include an N-type work function material or a P-type work function material. The N-type work function material may have a low work function of approximately 4.5 eV or less, and the P-type work function material may have a high work function of approximately 4.5 eV or more.

The upper word line WLU and the lower word line WLL may have different potentials. For example, in each of the memory cells MC1, MC2, MC3, and MC4, a word line driving voltage may be applied to the upper word line WLU, and a ground voltage may be applied to the lower word line WLL. The lower word line WLL may serve to block interference of the upper word lines WLU between the memory cells MC that are positioned vertically in the first direction D1. According to a variation of the illustrated embodiment or another embodiment of the present invention, a ground voltage may be applied to the upper word line WLU, and a word line driving voltage may be applied to the lower word line WLL. According to another embodiment of the present invention, the upper word line WLU and the lower word line WLL may be coupled to each other.

The active layer ACT may be formed of one or more suitable semiconductor materials, including, for example, polysilicon. The active layer ACT may include a plurality of impurity regions. The impurity regions may include a first and a second impurity regions. The first and second impurity regions may be a source and a drain region, respectively. The first and second impurity regions may be a drain region and a source region, respectively. The active layer ACT may include doped polysilicon, undoped polysilicon, amorphous silicon, or an oxide semiconductor material. The first source/drain region SD1 and the second source/drain region SD2 may be doped with an N-type impurity or a P-type impurity. The first source/drain region SD1 and the second source/drain region SD2 may be doped with an impurity of the same conductivity type. The first source/drain region SD1 and the second source/drain region SD2 may be doped with an N-type impurity. The first source/drain region SD1 and the second source/drain region SD2 may be doped with a P-type impurity. The first source/drain region SD1 and the second source/drain region SD2 may include at least one impurity selected among arsenic (As), phosphorus (P), boron (B), indium (In), and a combination thereof. The bit line BL may be electrically connected to a first edge portion of the active layer ACT, and a capacitor CAP may be electrically connected to a second edge portion of the active layer ACT. The first edge portion of the active layer ACT may be provided by the first source/drain regions SD1, and the second edge portion of the active layer ACT may be provided by the second source/drain regions SD2. The active layer ACT may further include a channel CH. The channel CH may be defined between the first source/drain area SD1 and the second source/drain area SD2. The upper word line WLU and the lower word line WLL may face each other with the channel CH interposed therebetween.

The capacitor CAP may be horizontally positioned from the transistor TR. The capacitor CAP may horizontally extend from the active layer ACT in the second direction D2. The capacitor CAP may include a storage node SN, a dielectric layer DE, and a plate node PN. The storage node SN, the dielectric layer DE, and the plate node PN may be horizontally arranged in the second direction D2. The storage node SN may have a horizontally oriented cylinder shape, and the plate node PN may have a shape that extends toward the cylinder inner wall and cylinder outer wall of the storage node SN. The dielectric layer DE may be positioned inside the storage node SN while surrounding the plate node PN. The plate node PN may be coupled to the plate line PL. The storage node SN may be electrically connected to the second source/drain region SD2. A portion of the second source/drain region SD2 may extend into the inside of the storage node SN.

The capacitor CAP may include a Metal-Insulator-Metal (MIM) capacitor. The storage node SN and the plate node PN may include a metal-based material. The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed as a composite layer including two or more layers of the high-k materials mentioned above.

The dielectric layer DE may be formed of zirconium-based oxide. The dielectric layer DE may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as zirconium oxide-based layer ($ZrO_2$-based layer). According to another embodiment of the present invention, the dielectric layer DE may be formed of a hafnium-based oxide. The dielectric layer DE may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide (HfO$_2$) are sequentially stacked. The HA stack and the HAH stack may be referred to as a hafnium oxide-based layer (HfO$_2$-based layer). In the ZA stack, ZAZ stack, HA stack, and HAH stack, aluminum oxide (Al$_2$O$_3$) may have a larger band gap than zirconium oxide (ZrO$_2$) and hafnium oxide (HfO$_2$). Aluminum oxide (Al$_2$O$_3$) may have a lower dielectric constant than zirconium oxide (ZrO$_2$) and hafnium oxide (HfO$_2$). Accordingly, the dielectric layer DE may include a stack of a high-k material and a high band gap material having a larger band gap than the high-k material. The dielectric layer DE may include, for example, silicon oxide (SiO$_2$) as a high band gap material other than aluminum oxide (Al$_2$O$_3$). Since the dielectric layer DE contains a high band gap material, leakage current may be suppressed. The high band gap material may be extremely thin. The high bandgap material may be thinner than the high-k material. According to another embodiment of the present invention, the dielectric layer DE may include a laminated structure in which a high-k material and a high band gap material are alternately stacked, for example, a ZAZA (ZrO$_2$/Al$_2$O$_3$/ZrO$_2$/Al$_2$O$_3$), a ZAZAZ (ZrO$_2$/Al$_2$O$_3$/ZrO$_2$/Al$_2$O$_3$/ZrO$_2$), a HAHA (HfO$_2$/Al$_2$O$_3$/HfO$_2$/Al$_2$O$_3$), or a HAHAH (HfO$_2$/Al$_2$O$_3$/HfO$_2$/Al$_2$O$_3$/HfO$_2$) laminated structure. In the laminated structure above, an aluminum oxide (Al$_2$O$_3$) layer may be extremely thin.

According to another embodiment of the present invention, the dielectric layer DE may include a stack structure, a laminate structure, or a mixture structure including zirconium oxide, hafnium oxide, and aluminum oxide.

According to another embodiment of the present invention, an interface control layer (not shown) for reducing leakage current may be further formed between the storage node SN and the dielectric layer DE. The interface control layer may include titanium oxide (TiO$_2$). The interface control layer may also be formed between the plate node PN and the dielectric layer DE.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide (RuO$_2$), iridium oxide (IrO$_2$), platinum (Pt), molybdenum (Mo), molybdenum oxide (MoO), a titanium nitride/tungsten (TiN/W) stack, and a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN, and titanium nitride (TiN) may serve as a substantial capacitor CAP. Tungsten nitride may be a low resistance material. The bottom portion of the plate line PL may be insulated from the substrate LS.

The storage node SN may have a three-dimensional structure. The storage node SN may have a horizontal three-dimensional structure that is oriented in the second direction D2. As an example of the three-dimensional structure, the storage node SN may have a cylinder shape, a pillar shape, or a pylinder shape. The pylinder shape may refer to a structure in which a pillar shape and a cylinder shape are merged.

A portion of the dielectric layer DE may be positioned between the word line WL and the storage node SN.

Figure 4A:
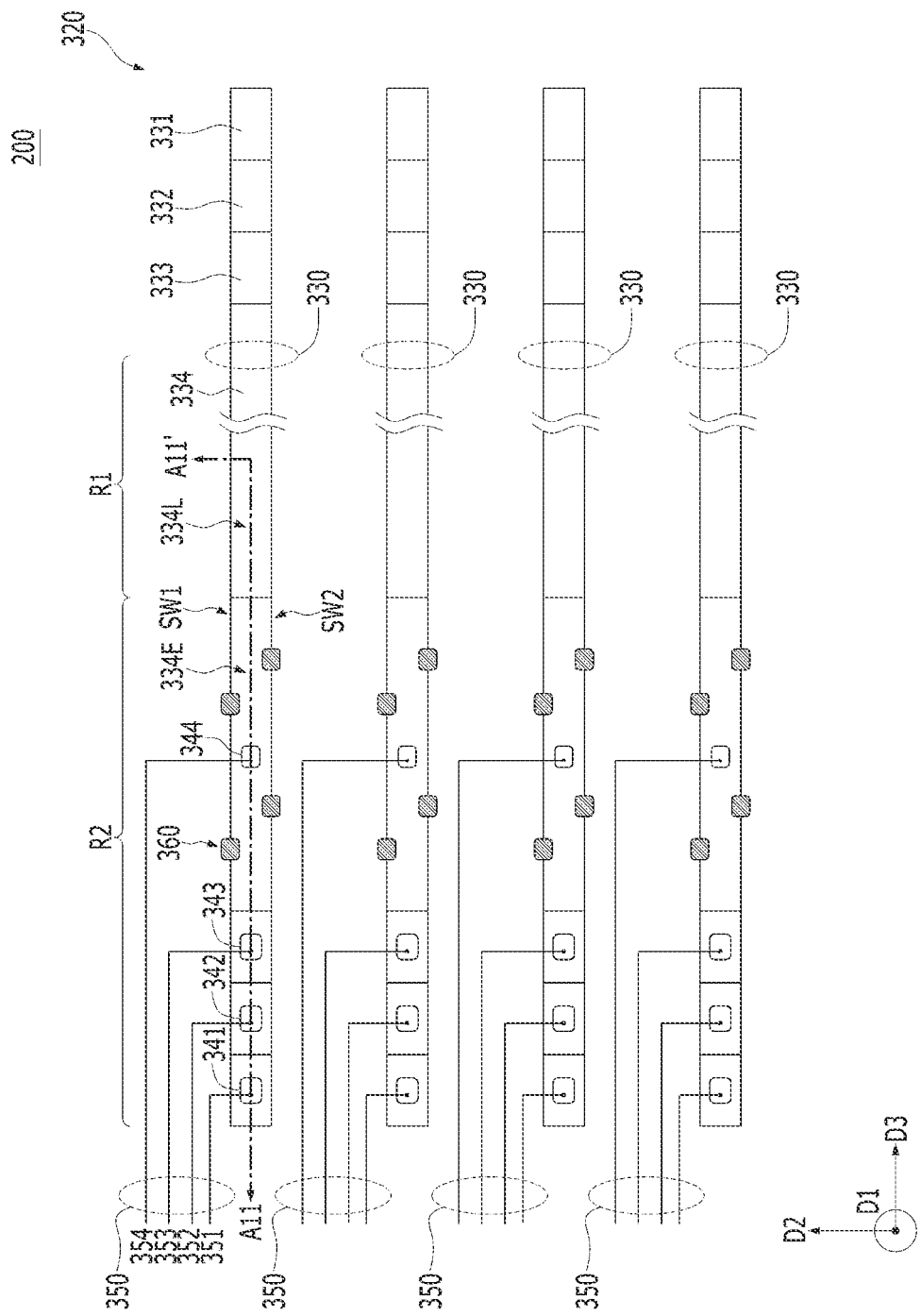

FIG. 4A is a plan view illustrating a memory device 200 in accordance with another embodiment of the present invention, and FIG. 4B is a cross-sectional view taken along a line A11-A11' shown in FIG. 4A. In FIGS. 4A and 4B, the same reference numerals as those in FIGS. 1 to 3 may denote the same constituent elements. Hereinafter, detailed description on the constituent elements of FIGS. 4A and 4B also appearing in FIGS. 1 to 3 may be omitted.

Figure 4C:
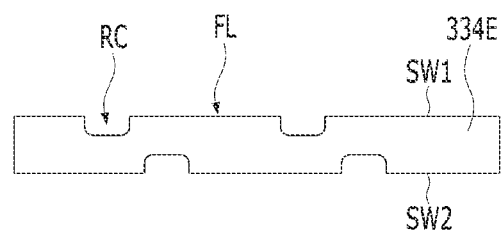
FIG. 4C is a detailed plan view illustrating a word line edge portion 334E.

Referring to FIGS. 4A to 4C, the memory device 200 may include a memory cell array stack 320 over a peripheral structure 310. The memory cell array stack 320 may include a plurality of memory cell arrays. For example, as shown in FIGS. 1 to 3, the memory cell array stack 320 may include a memory cell array MCA including a plurality of memory cells. FIG. 4A shows an example in which four memory cell arrays MCA are arranged in the second direction D2.

The memory cell array stack 320 may include a plurality of word line stacks 330. Each of the word line stacks 330 may include a plurality of word lines 331, 332, 333 and 334, and the word lines 331, 332, 333 and 334 may be vertically stacked in the first direction D1. The word lines 331, 332, 333 and 334 may extend in the third direction D3. The word line stacks 330 may be spaced apart from each other in the second direction D2, and each of the word line stacks 330 may extend in the third direction D3. Each word line stack 330 may further include a plurality of dielectric layers 331', 332', 333', and 334'. The dielectric layers 331', 332', 333' and 334' and the word lines 331, 332, 333 and 334 may be alternately stacked in the first direction D1. Each word line stack 330 may include an alternating stack of the dielectric layers 331', 332', 333' and 334' and the word lines 331, 332, 333 and 334.

The memory cell array stack 320 may include a first region R1 and a second region R2. The first region R1 may be a region in which memory cells are formed. The second region R2 may be a region in which a contact plug structure 340 is formed. The word lines 331, 332, 333 and 334 may include word line body portions 331L, 332L, 333L and 334L and word line edge portions 331E, 332E, 333E and 334E, respectively. The word line body portions 331L, 332L, 333L and 334L may be positioned in the first region R1. The word line edge portions 331E, 332E, 333E and 334E may be positioned in the second region R2. The word line edge portions 331E, 332E, 333E and 334E may be coupled to contact plug structure 340. The contact plug structure 340 may be coupled to a metal line structure 350. The contact plug structure 340 may include a plurality of contact plugs 341, 342, 343 and 344. The contact plugs 341, 342, 343 and 344 may be coupled to the word line edge portions 331E, 332E, 333E and 334E, respectively. The metal line structure 350 may include a plurality of metal lines 351, 352, 353 and 354. The metal lines 351, 352, 353 and 354 may be coupled to contact plugs 341, 342, 343 and 344, respectively. The word line edge portions 331E, 332E, 333E and 334E may have different lengths in the third direction D3 to form a stepped structure in the first direction D1. The peripheral structure 310 may include a peripheral circuit for driving the word lines 331, 332, 333 and 334. The peripheral circuit (not shown) of the peripheral structure 310 may be positioned at a lower level than the word line stacks 330, and it may be electrically connected to the word lines 331, 332, 333 and 334 through the metal line structure 350. According to another embodiment of the present invention, the peripheral structure 310 may be positioned at a higher level than the word line stacks 330.

The memory cell array stack 320 may include a double word line structure. For example, among the word lines 331, 332, 333 and 334, the word lines 332 and 334 may correspond to an upper word line (WLU in FIG. 3), and the word lines 331 and 333 may correspond to a lower word line (WLL in FIG. 3). The word lines 331 and 333 may be coupled to the metal lines 351 and 353 through the contact plugs 341 and 343, and the word lines 332 and 334 may be coupled to the metal lines 352 and 354 through the contact plugs 342 and 344. A word line driving voltage may be applied to the metal lines 352 and 354, and a ground voltage may be applied to the metal lines 351 and 353.

Each of the word line stacks 330 may include lower word lines WLL and upper word lines WLU that are alternately stacked vertically over the peripheral structure 310. Although not illustrated, horizontally oriented active layers (refer to 'ACT' shown in FIGS. 1 to 3) may be positioned between the lower word lines WLL and the upper word lines WLU, as illustrated in FIGS. 1 to 3. The active layers may be horizontally oriented in a direction intersecting with the lower word lines WLL and the upper word lines WLU. A vertically oriented bit line (refer to 'BL' shown in FIGS. 1 to 3) may be formed to be commonly coupled to one sides of the active layers, while storage nodes (refer to 'SN' shown in FIGS. 2 and 3) may be formed to be respectively coupled to the other sides of the active layers.

The memory device 200 may further include a plurality of supporters 360. The supporters 360 may support the word line stacks 330. The supporters 360 may be vertically oriented in the first direction D1. The supporters 360 may be coupled to at least one sidewall of the word line stacks 330. The individual word line stacks 330 may include a first sidewall SW1 and a second sidewall SW2 that are facing each other. The first sidewall SW1 and the second sidewall SW2 may be parallel to each other and may extend in the third direction D3. The supporters 360 may be coupled to the first sidewall SW1. The supporters 360 may be coupled to the second sidewall SW2. The supporters 360 may be coupled to the first sidewall SW1 and the second sidewall SW2. The supporters 360 may support all of the word lines 331, 332, 333, and 334. The supporters 360 may support the word line edge portions 331E, 332E, 333E, and 334E. The word line edge portions 331E, 332E, 333E, and 334E may partially cover the sidewalls of the supporters 360. The supporters 360 may also be referred to as slits. The supporters 360 may be formed of dielectric pillars. The supporters 360 may include, for example, silicon oxide.

FIG. 4C is a detailed plan view illustrating a word line edge portion 334E.

Referring to FIG. 4C, the word line edge portion 334E may include a first sidewall SW1 and a second sidewall SW2, and each of the first sidewall SW1 and the second sidewall SW2 may include flat surfaces FL and recess surfaces RC. The recess surfaces RC may partially cover the sidewalls of the supporters 360. The flat surfaces FL may not contact the supporters 360.

Other word line edge portions 331E, 332E, and 333E may also include flat surfaces FL and recess surfaces RC as well. The recess surfaces RC may be shaped to accommodate the supporters 360.

The first sidewall SW1 and the second sidewall SW2 of each word line stack 330 may include flat surfaces FL and recess surfaces RC, and the supporters 360 may contact the recess surfaces RC.

The supporters 360 may be formed before the word lines 331, 332, 333, and 334.

As described above, the supporters 360 may be able to prevent the word lines 331, 332, 333, and 334 from being collapsed. Also, the supporters 360 may be able to prevent the word line edge portions 331E, 332E, 333E, and 334E from being bent in the second region R2.

FIGS. 5A to 5D are perspective views illustrating application examples of supporters. In FIGS. 5A to 5D, the same reference numerals as those in FIGS. 4A to 4C may denote the same constituent elements. Hereinafter, detailed descriptions on the constituent elements of FIGS. 5A to 5D also appearing in FIGS. 4A to 4C may be omitted.

Figure 5A:
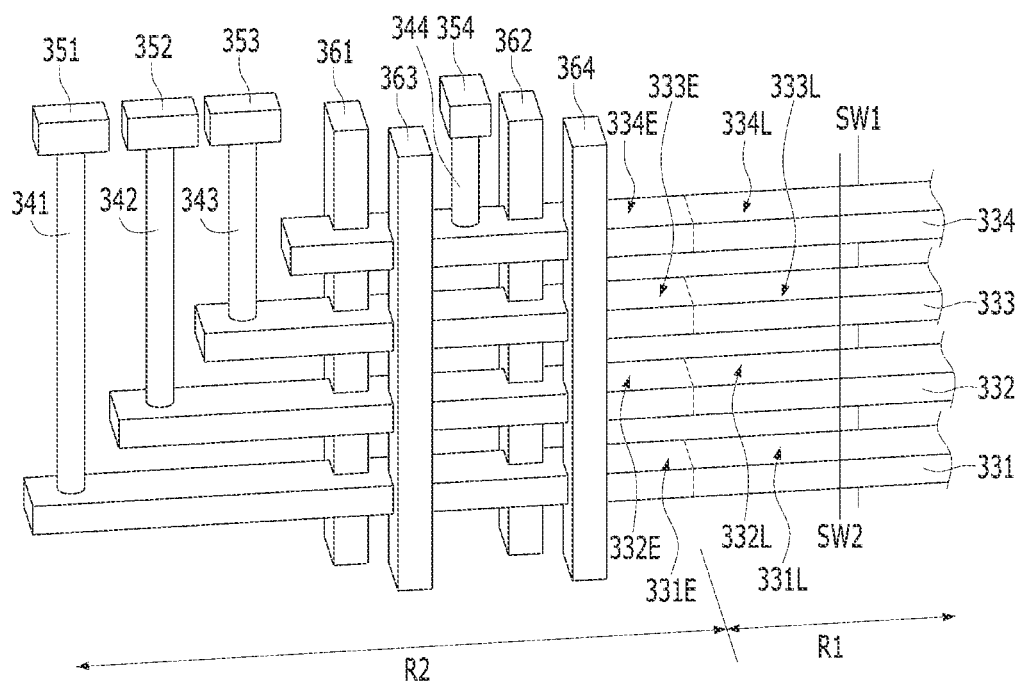
FIGS. 5A to 5D are perspective views illustrating application examples of supporters.

Referring to FIG. 5A, the supporters 361 and 362 may contact the first sidewalls SW1 of the word line edge portions 331E, 332E, 333E, and 334E, and the supporters 363 and 364 may contact the second sidewalls SW2 of the word line edge portions 331E, 332E, 333E, and 334E.

Figure 5B:
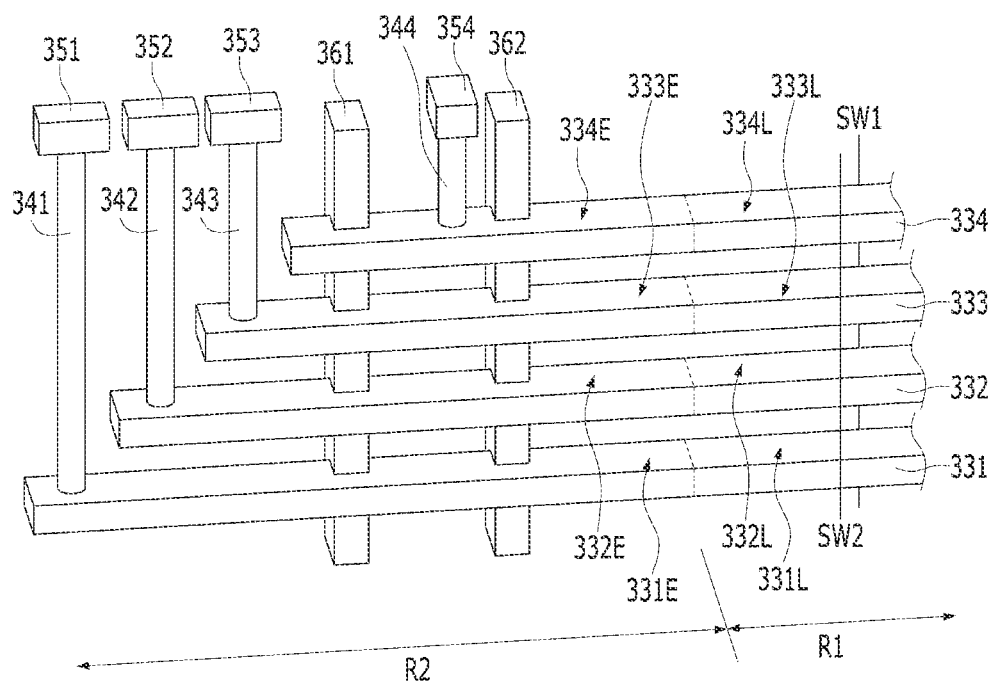

Referring to FIG. 5B, the supporters 361 and 362 may contact the first sidewalls SW1 of the word line edge portions 331E, 332E, 333E, and 334E. The supporters 361 and 362 may not contact the second sidewalls SW2 of the word line edge portions 331E, 332E, 333E, and 334E.

Figure 5C:
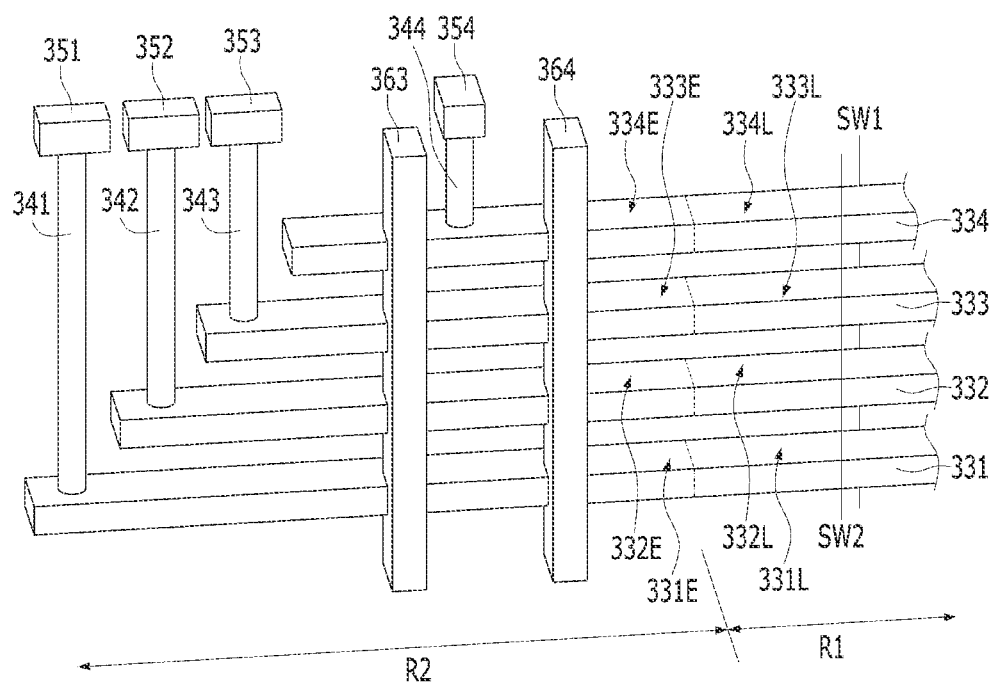

Referring to FIG. 5C, the supporters 363 and 364 may contact the second sidewalls SW2 of the word line edge portions 331E, 332E, 333E, and 334E. The supporters 363 and 364 may not contact the first sidewalls SW1 of the word line edge portions 331E, 332E, 333E, and 334E.

Figure 5D:
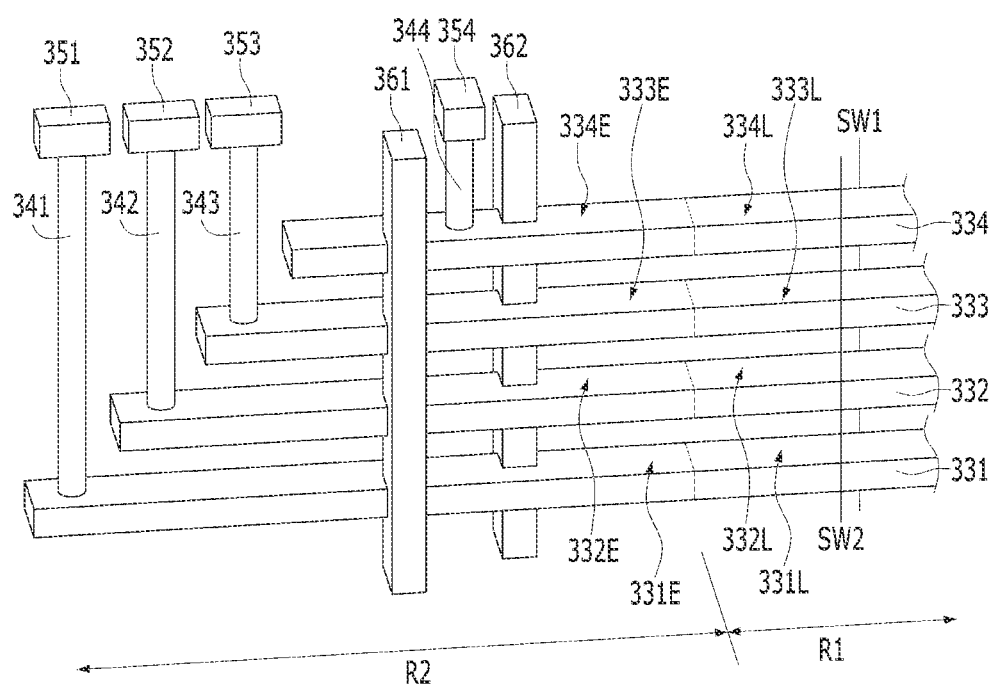

Referring to FIG. 5D, the supporter 362 may contact the first sidewalls SW1 of the word line edge portions 331E, 332E, 333E, and 334E, and the supporter 363 may contact the second sidewalls SW2 of the word line edge portions 331E, 332E, 333E, and 334E.

According to other embodiments of the present invention, the word line edge portions 331E, 332E, 333E, and 334E may be supported by one supporter among the supporters 361, 362, 363, and 364. For example, the word line edge portions 331E, 332E, 333E, and 334E may be supported by the supporter 361.

Figure 6:
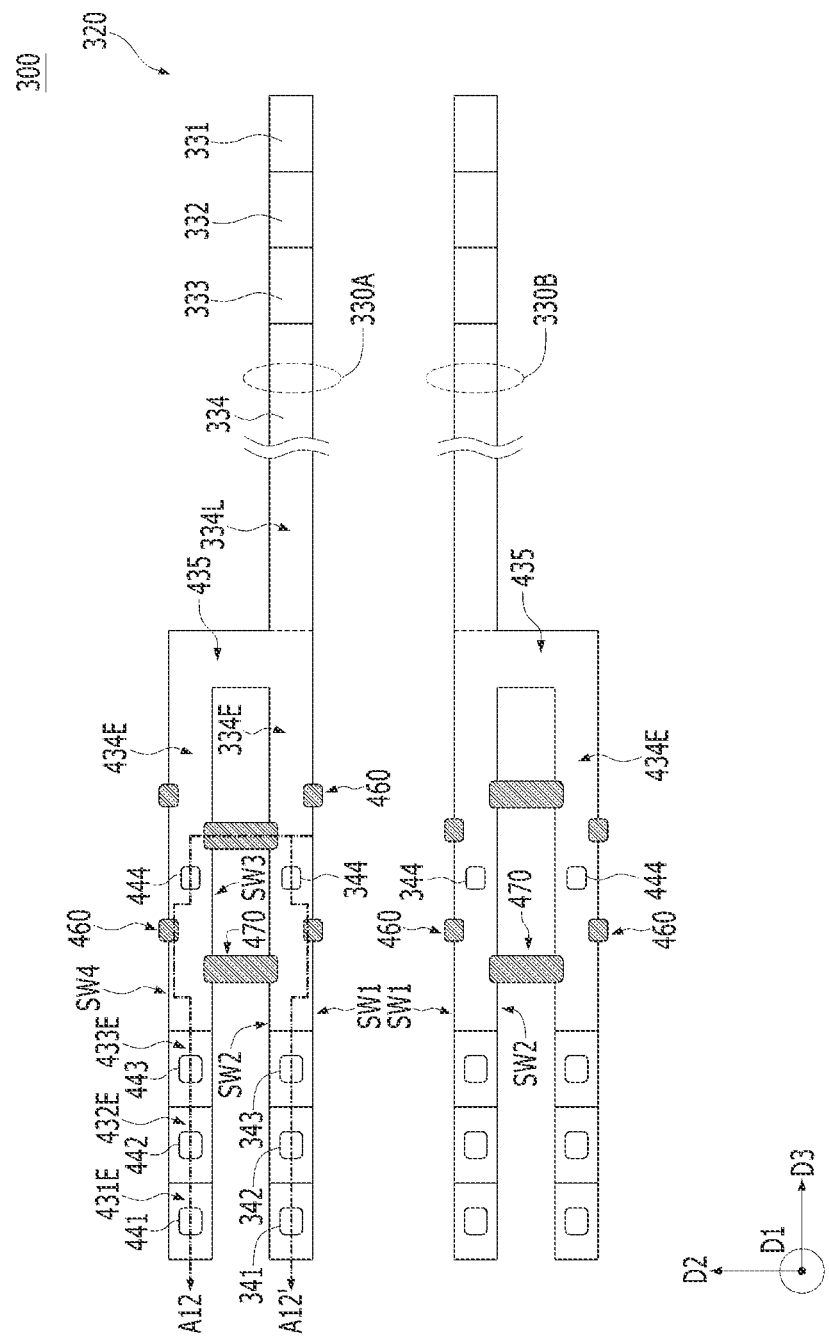
FIG. 6 is a diagram illustrating a memory device in accordance with another embodiment of the present invention.
Figure 7:
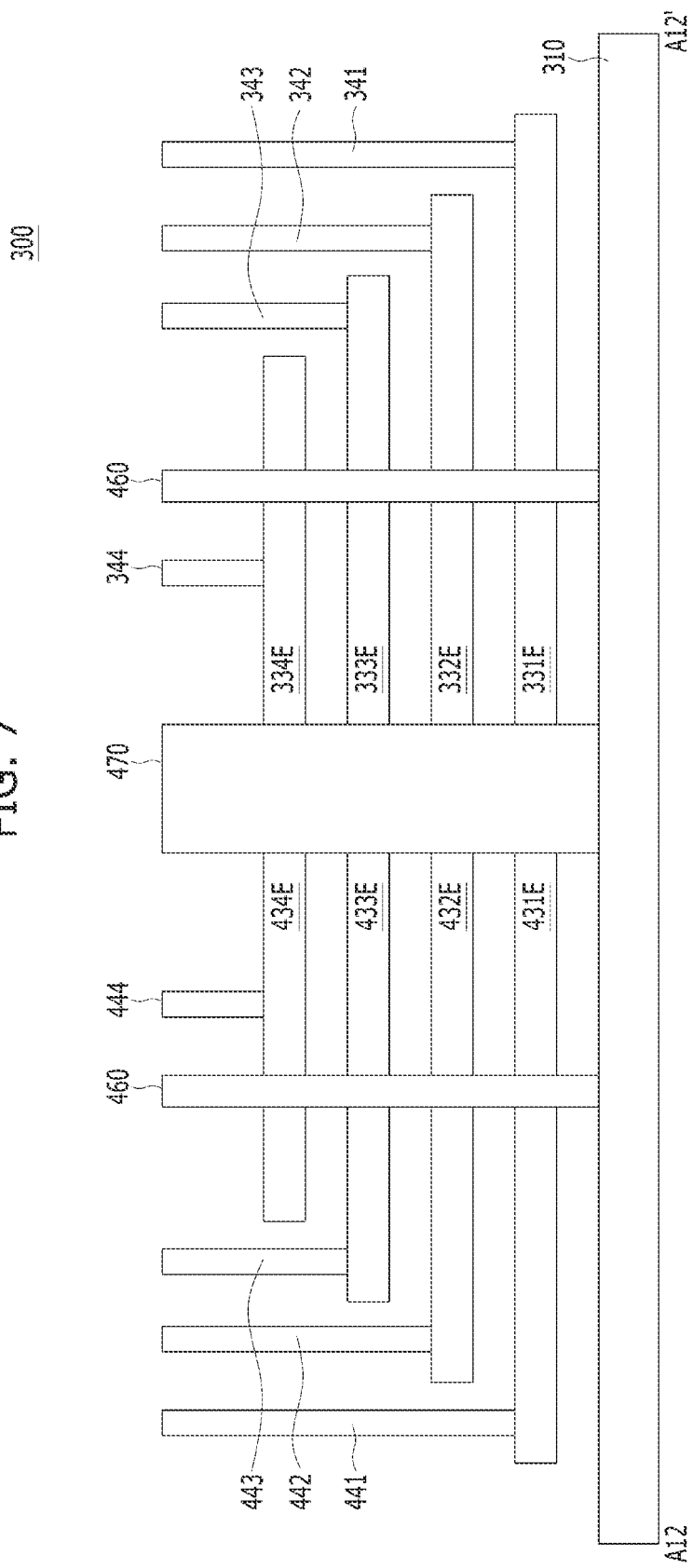
FIG. 7 is a cross-sectional view taken along a line A12-A12' shown in FIG. 6.

FIG. 6 is a diagram illustrating a memory device in accordance with another embodiment of the present invention. FIG. 7 is a cross-sectional view taken along a line A12-A12' shown in FIG. 6. In FIGS. 6 and 7, the same reference numerals as those in FIGS. 4A to 5D may denote the same constituent element. Hereinafter, detailed descriptions for the constituent elements FIGS. 6 and 7 also appearing in FIGS. 4A to 5D may be omitted.

Referring to FIGS. 6 and 7, the memory device 300 may include a peripheral structure 310 and a memory cell array stack 320 positioned over the peripheral structure 310. As described in the above embodiments, the memory cell array stack 320 may include a plurality of memory cells. Each of the memory cells may include a transistor, a word line, a capacitor, and a bit line. In the following embodiments, illustration and description of the transistor, the capacitor, and the bit line may be omitted.

The memory cell array stack 320 may include a plurality of word line stacks, e.g., word line stacks 330A and 330B. Each of the word line stacks 330A and 330B may include a plurality of word lines, e.g., word lines 331, 332, 333, and 334. The word lines 331, 332, 333, and 334 may be vertically stacked in the first direction D1. The word lines 331, 332, 333, and 334 may extend in the third direction D3. The word line stacks 330A and 330B may be spaced apart from each other in the second direction D2, and extend in the third direction D3.

Referring to FIGS. 4A, 4B, 6, and 7, the word lines 331, 332, 333, and 334 may include word line body portions 331L, 332L, 333L, 334L and word line edge portions 331E, 332E, 333E, and 334E respectively. The word line body portions 331L, 332L, 333L, and 334L may be positioned in the first region R1, and the word line edge portions 331E, 332E, 333E, and 334E may be positioned in the second region R2. The word line edge portions 331E, 332E, 333E, and 334E may be coupled to the contact plug structure 340. The contact plug structure 340 may be coupled to a metal line structure 350. The contact plug structure 340 may include a plurality of contact plugs 341, 342, 343, and 344, and the contact plugs 341, 342, 343, and 344 may be coupled to the word line edge portions 331E, 332E, 333E and 334E. The metal line structure 350 may include a plurality of metal lines 351, 352, 353 and 354. The metal lines 351, 352, 353 and 354 may be coupled to the contact plugs 341, 342, 343 and 344, respectively. The word line edge portions 331E, 332E, 333E, and 334E may have different lengths in the third direction D3. The word line edge portions 331E, 332E, 333E, and 334E may form a stepped structure in the first direction D1.

The memory cell array stack 320 may include a double word line structure. The word lines 331 and 333 may be coupled to the metal lines 351 and 353 through the contact plugs 341 and 343, and the word lines 332 and 334 may be coupled to the metal line 352 and 354 through the contact plugs 342 and 344. A word line driving voltage may be applied to the metal lines 352 and 354, and a ground voltage may be applied to the metal lines 351 and 353.

The memory device 300 may further include a plurality of small supporters 460. The small supporters 460 may support all of the word lines 331, 332, 333, and 334. The small supporters 460 may support the word line edge portions 331E, 332E, 333E, and 334E. The word line edge portions 331E, 332E, 333E, and 334E may include a first sidewall SW1 and a second sidewall SW2 that are facing each other. The first sidewall SW1 and the second sidewall SW2 may be parallel to each other and may extend in the third direction D3. The small supporters 460 may be coupled to the first sidewalls SW1 of the word line edge portions 331E, 332E, 333E, and 334E. The small supporters 460 may not be coupled to the second sidewalls SW2 of the word line edge portions 331E, 332E, 333E, and 334E. The small supporters 460 may be spaced apart from each other. The word line edge portions 331E, 332E, 333E, and 334E may partially cover the sidewalls of the small supporters 460. The small supporters 460 may be referred to as small slits. The small supporters 460 may be formed of a dielectric material. The small supporters 460 may include, for example, silicon oxide.

The memory device 300 may further include a plurality of additional word line edge portions 431E, 432E, 433E, and 434E. The additional word line edge portions 431E, 432E, 433E, and 434E and the word line edge portions 331E, 332E, 333E, and 334E may be parallel to each other. The additional word line edge portions 431E, 432E, 433E, and 434E and the word line edge portions 331E, 332E, 333E, and 334E may be coupled to each other through an interconnection portion 435. The interconnection portion 435 may be a portion of the additional word line edge portions 431E, 432E, 433E, and 434E. The word line edge portions 331E, 332E, 333E, and 334E and the additional word line edge portions 431E, 432E, 433E, and 434E may be electrically connected to each other. The additional word line edge portions 431E, 432E, 433E, and 434E may have different lengths in the third direction D3. The additional word line edge portions 431E, 432E, 433E, and 434E may form a stepped structure in the first direction D1. The sidewalls of the word line edge portions 331E, 332E, 333E, and 334E and the sidewalls of the additional word line edge portions 431E, 432E, 433E, and 434E may include flat surfaces FL and recess surfaces RC as shown in FIG. 4C. The additional word line edge portions 431E, 432E, 433E, and 434E may include a third sidewall SW3 and a fourth sidewall SW4 which is parallel to the third sidewall SW3. Each of the third sidewall SW3 and the fourth sidewall SW4 may include a plurality of recess surfaces, and large supporters 470 may contact the recess surfaces of the third sidewall SW3, and small supporters 460 may contact the recess surfaces of the fourth sidewall SW4. The word line edge portions 331E, 332E, 333E, and 334E may be referred to as 'first edge portions', and the additional word line edge portions 431E, 432E, 433E, and 434E may be referred to as 'second edge portions'.

The memory device 300 may further include additional contact plugs 441, 442, 443, and 444, and the additional contact plugs 441, 442, 443, and 444 may include additional word line edge portions 431E, 432E, 433E, and 434E, respectively.

The memory device 300 may further include a plurality of large supporters 470. The large supporters 470 may support the word line stacks 330A and 330B. The large supporters 440 may be vertically oriented in the first direction D1. The large supporters 470 may be coupled to the sidewall of at least one word line stack among the word line stack 330A and 330B. The large supporters 470 may be coupled to the second sidewall SW2 of the word line stack 330A. The other large supporters 470 may be coupled to the second sidewall SW2 of the word line stack 330B. The large supporters 470 may not be coupled to the first sidewall SW1 of the word line stack 330A and the first sidewall SW1 of the word line stack 330B. The large supporters 470 may be spaced apart from each other.

The large supporters 470 may support all of the word lines 331, 332, 333, and 334. The large supporters 470 may support the word line edge portions 331E, 332E, 333E, and 334E. The word line edge portions 331E, 332E, 333E, and 334E may partially cover the sidewalls of the large supporters 470. The large supporters 470 may support additional word line edge portions 431E, 432E, 433E, and 434E. The additional word line edge portions 431E, 432E, 433E, and 434E may partially cover the sidewalls of the large supporters 470. The large supporters 470 may be referred to as large slits. The large supporters 470 may be formed of a dielectric material. The large supporters 470 may include, for example, silicon oxide. The small supporters 460 and the large supporters 470 may be formed of the same material.

The large supporters 470 may be positioned between the word line edge portions 331E, 332E, 333E, and 334E and the additional word line edge portions 431E, 432E, 433E, and 434E. The large supporters 470 may simultaneously support the word line edge portions 331E, 332E, 333E, and 334E and the additional word line edge portions 431E, 432E, 433E, and 434E. The small supporters 460 may individually support the word line edge portions 331E, 332E, 333E, and 334E and the additional word line edge portions 431E, 432E, 433E, and 434E. The distance between the word line edge portions 331E, 332E, 333E, and 334E and the additional word line edge portions 431E, 432E, 433E, and 434E may be smaller than the length of the large supporters 470 in the second direction D2.

The large supporters 470 may be larger in size than the small supporters 460. Here, the size may include at least one among diameter, width, and length.

Referring to the word line stack 330A, the small supporters 460 may be formed between the additional contact plug 444 and an edge of the additional word line edge portion 434E. The small supporters 460 may partially penetrate the sidewall of one among the additional word line edge portions 431E, 432E, 433E, and 434E. The small supporters 460 may be formed between the contact plug 344 and an edge of the word line edge portion 334E. The small supporters 460 may partially penetrate the second sidewall SW2 of the word line edge portions 331E, 332E, 333E, and 334E.

As described above, the small supporters 460 and the large supporters 470 may prevent the word lines 331, 332, 333, and 334 from collapsing. Also, the small supporters 460 and the large supporters 470 may prevent the word line edge portions 331E, 332E, 333E, and 334E and the additional word line edge portions 431E, 432E, 433E, and 434E from becoming bent in the second region R2.

Since the word line stacks 330A and 330B include word line edge portions 331E, 332E, 333E, and 334E and additional word line edge portions 431E, 432E, 433E, 434E, the structural stability of the word line stacks 330A and 330B may be further increased.

Since the additional contact plugs 441, 442, 443, and 444 are further included, contact resistance may be improved, and the likelihood of the contact being not open may be improved as well.

The word line edge portions 331E, 332E, 333E, and 334E and the additional word line edge portions 431E, 432E, 433E, and 434E may be referred to as 'word line pads' or 'word line contact pads'. The word line edge portions 331E, 332E, 333E, and 334E may be referred to as first word line pads, and the additional word line edge portions 431E, 432E, 433E, and 434E may be referred to as second word line pads. The word line stacks 330A and 330B may include a first word line pad and a second word line pad. Accordingly, the memory device 300 may include a double word line pad structure.

FIGS. 8A to 9B are diagrams illustrating memory devices in accordance with other embodiments of the present invention.

In FIGS. 8A and 8B, the same reference numerals as those in FIGS. 4A to 5D may denote the same constituent element. Hereinafter, detailed descriptions for the constituent elements of FIGS. 8A and 8B also appearing in FIGS. 4A to 5D may be omitted.

Referring to FIGS. 4A, 4B, 4C, and 8A, the memory device 500 may include a peripheral structure 310 and a memory cell array stack 320 which is positioned over the peripheral structure 310. As described in the above embodiments, the memory cell array stack 320 may include a plurality of memory cells, and each of the memory cells may include a transistor, a word line, a capacitor, and a bit line. In the following embodiments, illustration and description of the transistor, the capacitor, and the bit line may be omitted.

The memory cell array stack 320 may include a plurality of word line stacks 330. Each of the word line stacks 330 may include a plurality of word lines 331, 332, 333, and 334, vertically stacked in the first direction D1. The word lines 331, 332, 333, and 334 may extend in the third direction D3. The word line stacks 330 may be spaced apart from each other in the second direction D2, and the individual word line stacks 330 may extend in the third direction D3.

The memory device 500 may further include a plurality of supporters 360. The supporters 360 may support the word line stacks 330. The supporters 360 may be vertically oriented in the first direction D1. The supporters 360 may be coupled to the sidewall of at least one word line stack among the word line stacks 330. Each of the word line stacks 330 may include a first sidewall SW1 and a second sidewall SW2 that are facing each other. The first sidewall SW1 and the second sidewall SW2 may be parallel to each other, and may extend in the third direction D3. At least some of the supporters 360 may be coupled to the first sidewall SW1. At least some of the supporters 360 may be coupled to the second sidewall SW2. In the illustrated embodiment, at least some of the supporters 360 may be coupled to the first sidewall SW1 and the second sidewall SW2. The supporters 360 may support all of the word lines 331, 332, 333, and 334. The supporters 360 may support the word line edge portions 331E, 332E, 333E, and 334E. The word line edge portions 331E, 332E, 333E, and 334E may partially cover the sidewalls of the supporters 360. The supporters 360 may be referred to as slits. The supporters 360 may be formed of dielectric pillars. The supporters 360 may include, for example, silicon oxide.

The supporters 360 may be disposed to support the respective step structures on which the contact plugs 341, 342, 343, and 344 land. In FIG. 4A, the supporters 360 may be disposed in the periphery of the word line stack 330 on which the contact plug 344 lands, and in FIG. 8A, the supporters 360 may be disposed to support the step structures on which the contact plugs 341, 342, 343 and 344 land. In this way, as the step structures are arranged to be supported, the supporting effect of the word line stacks 330 may be further increased.

Referring to FIGS. 4A, 4B, 4C, and 8B, a memory device 501 may further include a plurality of supporters 360. The supporters 360 may support the word line stacks 330. The supporters 360 may be vertically oriented in the first direction D1. The supporters 360 may be coupled to the sidewall of at least one word line stack among the word line stacks 330. The word line stack 330 may include a first sidewall SW1 and a second sidewall SW2 that are facing each other. The first sidewall SW1 and the second sidewall SW2 may be parallel to each other, and they may extend in the third direction D3. The supporters 360 may be coupled to the first sidewall SW1. The supporters 360 may be coupled to the second sidewall SW2. The supporters 360 may be coupled to the first sidewall SW1 and the second sidewall SW2. The supporters 360 may support all of the word lines 331, 332, 333, and 334. The supporters 360 may support the word line edge portions 331E, 332E, 333E, and 334E. The word line edge portions 331E, 332E, 333E, and 334E may partially cover the sidewalls of the supporters 360. The supporters 360 may be referred to as slits. The supporters 360 may be formed of dielectric pillars. The supporters 360 may include, for example, silicon oxide.

The supporters 360 may be disposed to support the respective step structures on which the contact plugs 341, 342, 343, and 344 land. The supporters 360 may support the word line edge portions 331E, 332E, 333E, and 334E on both sides of the word line. In FIGS. 4A and 8A, the supporters 360 may support the word line edge portions on one side of the word line stack 330, and in FIG. 8B, the supporters 360 may support the word line edge portions on both sides of the word line stack 330.

Figure 9A:
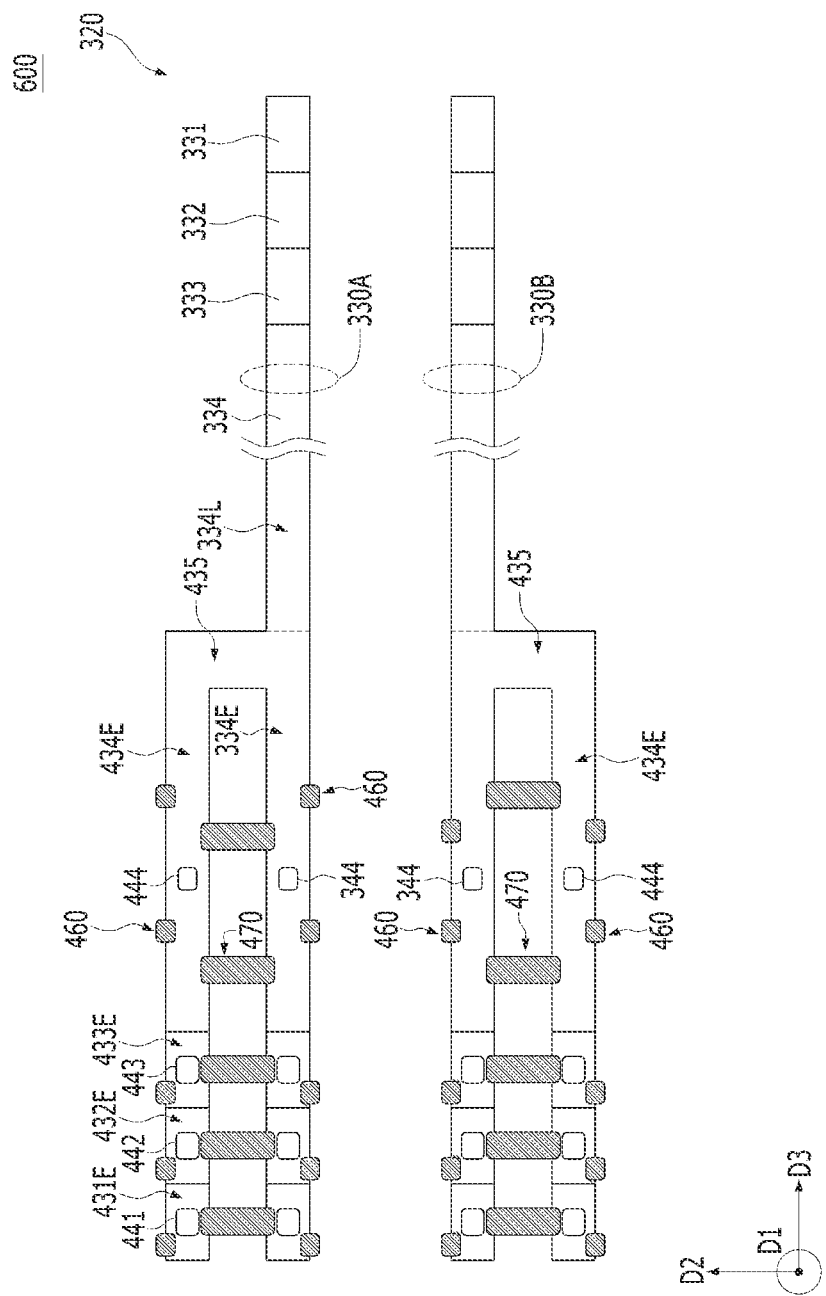
Figure 9B:
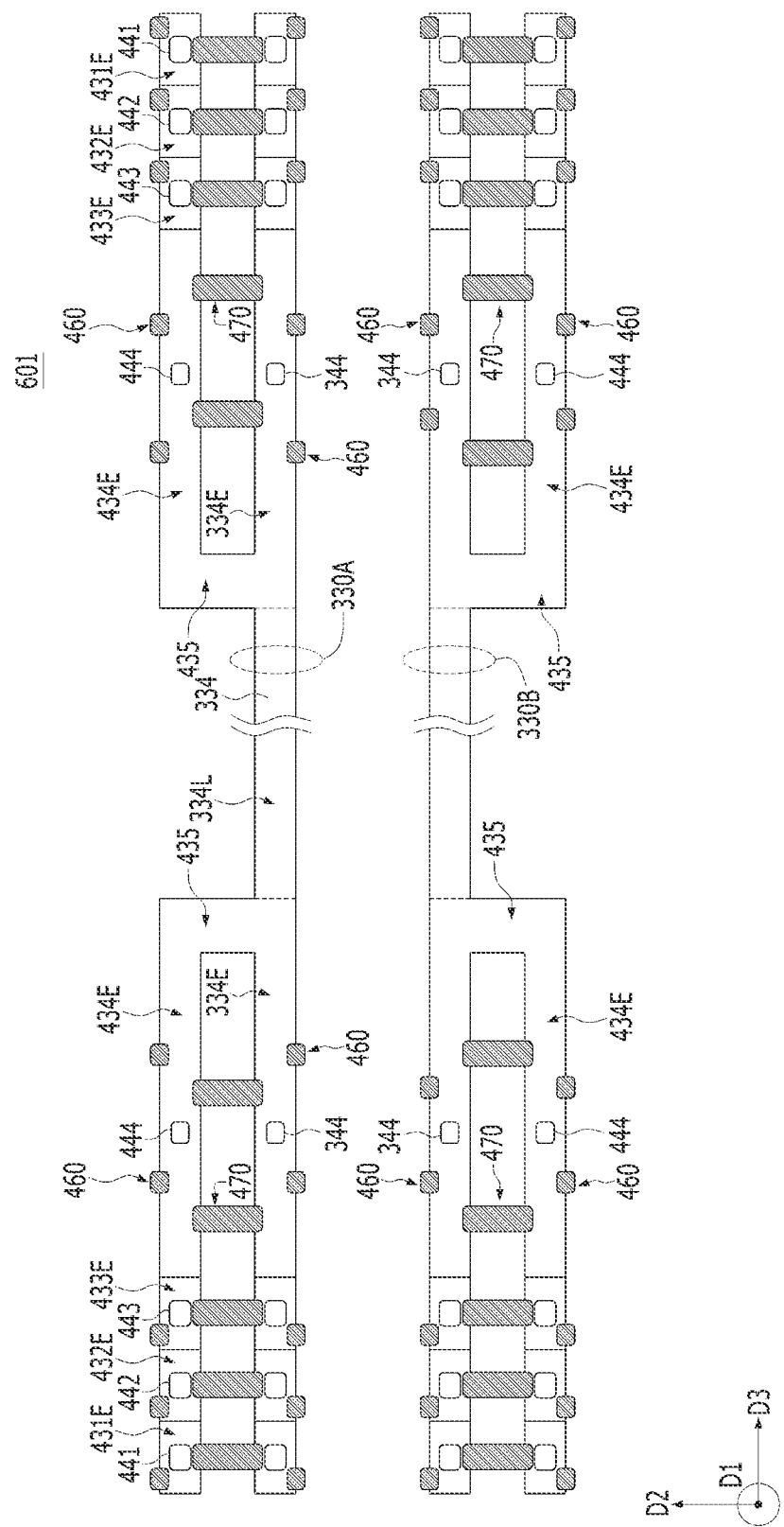

Referring to FIGS. 9A and 9B, the same reference numerals as those in FIGS. 4A to 6 may denote the same constituent elements. Hereinafter, detailed descriptions for the constituent elements of FIGS. 9A and 9B also appearing in FIGS. 4A to 6 may be omitted.

Referring to FIGS. 4A, 4B, 4C, 6 and 9A, a memory device 600 may include a plurality of small supporters 460 and a plurality of large supporters 470.

The small supporters 460 may support all of the word lines 331, 332, 333, and 334. The small supporters 460 may support the word line edge portions 331E, 332E, 333E, and 334E. The small supporters 460 may include, for example, silicon oxide.

The large supporters 470 may support the word line stacks 330A and 330B. The large supporters 440 may be vertically oriented in the first direction D1. The large supporters 470 may be coupled to the sidewall of at least one word line stack among the word line stacks 330A and 330B. The large supporters 470 may be coupled to the second sidewall SW2 of the word line stack 330A. Other large supporters 470 may be coupled to the second sidewall SW2 of the word line stack 330B. The large supporters 470 may not be coupled to the first sidewall SW1 of the word line stack 330A and the first sidewall SW1 of the word line stack 330B. The large supporters 470 may be spaced apart from each other.

The large supporters 470 may support all of the word lines 331, 332, 333, and 334. The large supporters 470 may support the word line edge portions 331E, 332E, 333E, and 334E. The word line edge portions 331E, 332E, 333E, and 334E may partially cover the sidewalls of the large supporters 470. The large supporters 470 may support additional word line edge portions 431E, 432E, 433E, and 434E. The additional word line edge portions 431E, 432E, 433E, and 434E may partially cover the sidewalls of the large supporters 470. The large supporters 470 may include, for example, silicon oxide. The small supporters 460 and the large supporters 470 may be formed of the same material.

The large supporters 470 may be positioned between the word line edge portions 331E, 332E, 333E, and 334E and the additional word line edge portions 431E, 432E, 433E, and 434E. The large supporters 470 may simultaneously support the word line edge portions 331E, 332E, 333E, and 334E and the additional word line edge portions 431E, 432E, 433E, and 434E. The small supporters 460 may individually support the word line edge portions 331E, 332E, 333E, and 334E and the additional word line edge portions 431E, 432E, 433E, and 434E. The distance between the word line edge portions 331E, 332E, 333E, 334E and the additional word line edge portions 431E, 432E, 433E, 434E may be smaller than the length of the large supporters 470 in the second direction D2.

The large supporters 470 may be larger in size than the small supporters 460. Here, the size may include at least one among diameter, width, and length.

The small supporters 460 and the large supporters 470 may be disposed to support the respective step structures on which the contact plugs 441, 442, 443, and 444 land. In FIG. 6, the small supporters 460 and the large supporters 470 may be disposed in the periphery of the word line stacks 330 on which the contact plug 444 lands, and in FIG. 9A, the small supporters 460 and the large supporters 470 may be disposed to support the respective step structures on which the contact plugs 441, 442, 443, and 444 land. In this way, as the step structures are disposed to be supported, the supporting effect of the word line stacks 330 may be further increased.

FIG. 9B is a modified example of FIG. 9A, in which the small supporters 460 and the large supporters 470 of a memory device 601 may be disposed to support the respective step structures on which the contact plugs 441, 442, 443, and 444 land. The small supporters 460 and the large supporters 470 may support the word line edge portions 331E, 332E, 333E, and 334E on both sides of a word line. In FIGS. 6 and 9A, the small supporters 460 and the large supporters 470 may support the word line edge portions on one side of the word line stacks 330, and in FIG. 9B, the small supporters 460 and the large supporters 470 may support the word line edge portions on both sides of the word line stacks 330.

According to an embodiment of the present invention, the supporters may be able to prevent the word lines from collapsing as well as preventing edge portions of a word line from being bent.

According to an embodiment of the present invention, the contact plugs and additional contact plugs may improve contact resistance as well as improving contact-not-open.

While the present invention has been described with respect to the specific embodiments, it may be apparent to those skilled in the art that various changes and modifications may be made without departing from the spirit and scope of the invention as defined in the following claims.

What is claimed is:

1. A memory device, comprising:
   a word line stack including word lines that are alternately stacked vertically over a substrate, and having an edge portion;
   at least one supporter extending vertically in a direction that the word lines are stacked and supporting the edge portion of the word line stack;
   contact plugs that are electrically connected to the word lines at the edge portion of the word line stack; and
   active layers positioned between the word lines, and horizontally oriented in a direction intersecting with the word lines,
   wherein the at least one supporter includes a plurality of dielectric pillars,
   wherein the edge portion of the word line stack includes a first sidewall and a second sidewall which is parallel to the first sidewall, and
   wherein the plurality of dielectric pillars are spaced apart from each other along at least one sidewall among the first sidewall and the second sidewall.

2. The memory device of claim 1, wherein
   the plurality of dielectric pillars directly contacts at least one sidewall among the first sidewall and the second sidewall.

3. The memory device of claim 1, wherein each of the first sidewall and the second sidewall includes at least one recess surface which extends vertically in the direction that the word lines are stacked, and
   the at least one recess surface directly contacts the at least one supporter.

4. The memory device of claim 1, wherein the at least one supporter includes silicon oxide.

5. The memory device of claim 1, further comprising:
   a bit line commonly coupled to one side of the active layers, wherein the bit line extends vertically in the direction that the word lines are stacked.

6. The memory device of claim 1, further comprising:
   storage nodes that are respectively coupled to another side of the active layers,
   wherein the storage nodes are vertically stacked in the direction that the word lines are stacked.

7. The memory device of claim 1, wherein the edge portion of the word line stack has a stepped structure in the direction that the word lines are stacked.

8. A memory device, comprising:
   a word line stack including word lines that are alternately stacked perpendicular to a substrate, and including an edge portion and an additional edge portion which is parallel to the edge portion;

at least one small supporter extending vertically in a direction that the word lines are stacked and supporting the edge portion and the additional edge portion, respectively;

at least one large supporter extending vertically in the direction that the word lines are stacked and supporting the edge portion and the additional edge portion in common;

contact plugs respectively electrically connected to the word lines in the edge portion;

additional contact plugs electrically connected to the word lines respectively in the additional edge portion; and active layers positioned between the word lines, and horizontally oriented in a direction intersecting with the word lines.

9. The memory device of claim 8, wherein the at least one large supporter has a larger size than the at least one small supporter.

10. The memory device of claim 8, wherein the edge portion and the additional edge portion are coupled to each other through an interconnection portion, and
a distance between the edge portion and the additional edge portion is smaller than a length of the large supporter.

11. The memory device of claim 8, wherein the at least one supporter includes silicon oxide.

12. The memory device of claim 8, further comprising:
a bit line commonly coupled to one side of the active layers, wherein the bit line extends vertically in the direction that the word lines are stacked.

13. The memory device of claim 8, further comprising:
storage nodes that are respectively coupled to another side of the active layers,
wherein the storage nodes are vertically stacked in the direction that the word lines are stacked.

14. The memory device of claim 8, wherein the substrate includes a peripheral circuit for driving the word lines, wherein the peripheral circuit is positioned at a level lower than the word line stack or positioned at a level higher than the word line stack.

15. The memory device of claim 8, wherein the edge portion of the word line stack includes a first sidewall and a second sidewall which is parallel to the first sidewall, and
the at least one small supporter supports the first sidewall, and
the at least one large supporter supports the second sidewall.

16. The memory device of claim 15, wherein each of the first sidewall and the second sidewall includes at least one first recess surface and at least one second recess surface that extend vertically in the direction that the word lines are stacked.

17. The memory device of claim 16, wherein the at least one first recess surface directly contacts the at least one small supporter, and
the at least one second recess surface directly contacts the at least one large supporter.

18. The memory device of claim 15, wherein the additional edge portion of the word line stack includes a third sidewall that faces the second sidewall and a fourth sidewall that is parallel to the third sidewall,
the at least one small supporter supports the fourth sidewall, and
the large supporter supports the third sidewall.

19. The memory device of claim 18, wherein each of the third sidewall and the fourth sidewall includes at least one third recess surface and at least one fourth recess surface that extends vertically in the direction that the word lines are stacked, where the at least one third recess surface directly contacts the at least one large supporter, and the at least one fourth recess surface directly contacts the at least one small supporter.

20. A memory device, comprising:
a plurality of memory cells vertically stacked over a substrate; and
at least one supporter extending vertically in a direction that the memory cells are stacked,
wherein each of the memory cells includes:
a bit line oriented perpendicular to the substrate;
a capacitor horizontally spaced apart from the bit line;
an active layer horizontally oriented between the bit line and the capacitor; and
a word line positioned over at least one surface among an upper surface and a lower surface of the active layer and extending horizontally in a direction intersecting with the active layer,
wherein edge portions of the word lines of the memory cells are supported by the at least one supporter,
wherein the at least one supporter includes a plurality of dielectric pillars,
wherein the edge portion of the word line stack includes a first sidewall and a second sidewall which is parallel to the first sidewall,
wherein each of the first and second sidewalls of the word line stack includes a plurality of first recessed sidewalls and a plurality of second recessed sidewalls, and
wherein the plurality of dielectric pillars are spaced apart from each other along at least one recessed sidewall among the first recessed sidewalls and the second recessed sidewalls.

21. The memory device of claim 20, further comprising:
contact plugs landing on the edge portions of the word lines.

22. The memory device of claim 20, wherein
the plurality of dielectric pillars directly contacts at least one recessed sidewall among the first recessed sidewalls and the second recessed sidewalls.

23. The memory device of claim 20, wherein the plurality of dielectric pillars include silicon oxide.

24. The memory device of claim 20, wherein each of the word lines includes:
a word line body portion vertically stacked in the direction that the memory cells are stacked;
first edge portions respectively extending from both ends of the word line body portion; and
a second edge portion extending from at least one first edge portion among the first edge portions and parallel to the at least one first edge portion, and
wherein the at least one supporter supports the at least one first edge portion and the second edge portion.

25. The memory device of claim 24, wherein the at least one supporter further includes:
at least one small supporter extending vertically in a direction that the word lines are stacked and supporting the at least one first edge portion and the second edge portion, respectively; and
at least one large supporter extending vertically in the direction that the word lines are stacked and supporting the at least one first edge portion and the second edge portion in common.

26. The memory device of claim 24, wherein the first edge portions and the second edge portions are formed in a stepped structure in the direction that the word lines are stacked.

* * * * *